United States Patent
Hwang (10) Patent No.: US 8,810,444 B2
(45) Date of Patent: Aug. 19, 2014

(54) ANALOG-TO-DIGITAL CONVERTING CIRCUIT AND ACCUMULATION CIRCUIT INCLUDING THE SAME

(71) Applicant: Samsung Electronics., Ltd., Suwon-si (KR)

(72) Inventor: Hee Chang Hwang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/832,013

(22) Filed: Mar. 15, 2013

(65) Prior Publication Data

US 2013/0257636 A1    Oct. 3, 2013

(30) Foreign Application Priority Data

Mar. 27, 2012    (KR) .................. 10-2012-0030861

(51) Int. Cl.
*H03M 1/12*    (2006.01)

(52) U.S. Cl.
USPC ............................ 341/155; 341/144; 341/163

(58) Field of Classification Search
USPC .................. 341/144–145, 155, 163
See application file for complete search history.

(56) References Cited

U.S. PATENT DOCUMENTS

| | | | | |
|---|---|---|---|---|
| 4,907,002 A | * | 3/1990 | Kawada | 341/172 |
| 5,986,598 A | | 11/1999 | Mittel | |
| 6,369,749 B1 | | 4/2002 | Frey, Jr. | |
| 7,155,470 B2 | | 12/2006 | Serizawa | |
| 7,532,145 B2 | | 5/2009 | Davidovici | |
| 7,576,678 B2 | * | 8/2009 | Chatal et al. | 341/163 |
| 7,629,917 B2 | | 12/2009 | Shinohara | |
| 8,120,520 B2 | * | 2/2012 | Jeong et al. | 341/163 |

FOREIGN PATENT DOCUMENTS

| | | |
|---|---|---|
| JP | 06152327 | 5/1994 |
| JP | 06326684 | 11/1994 |
| KR | 100170339 | 10/1998 |

* cited by examiner

*Primary Examiner* — Khai M Nguyen
(74) *Attorney, Agent, or Firm* — Volentine & Whitt, PLLC (57) ABSTRACT

An analog-to-digital converting circuit includes a first comparison circuit configured to compare a first analog signal associated with a first digital signal with an analog input signal and output a first selection signal based on a result of the comparison, a second comparison circuit configured to compare a second analog signal associated with a second digital signal with the analog input signal and output a second selection signal based on a result of the comparison, and a selection circuit configured to generate intermediate digital signals associated with the first digital signal and output one of the intermediate digital signals as the first digital signal and another of the intermediate digital signals as the second digital signal, based on the first selection signal and the second selection signal.

20 Claims, 11 Drawing Sheets

ANALOG-TO-DIGITAL CONVERTING CIRCUIT AND ACCUMULATION CIRCUIT INCLUDING THE SAME

CROSS-REFERENCE TO RELATED APPLICATION

This application claims priority under 35 U.S.C. §119 to Korean Patent Application No. 10-2012-0030861, filed on Mar. 27, 2012 in the Korean Intellectual Property Office (KIPO), the entire contents of which are incorporated herein by reference.

BACKGROUND

Example embodiments relate to an analog-to-digital converting circuit and an accumulation circuit including the analog-to-digital converting circuit, and more particularly, to an analog-to-digital converting circuit capable of performing analog-to-digital conversion on an analog input signal without delay, and an accumulation circuit including the analog-to-digital converting circuit.

An analog-to-digital converting circuit converts a continuous analog signal to a discrete digital signal. The analog-to-digital converting circuit converts a received analog voltage or a received analog current to a digital signal corresponding to the analog voltage or the analog current. The analog-to-digital converting circuit requires a conversion period or duration to convert an analog input signal to a digital signal. The conversion period of a given analog-to-digital converting circuit causes the frequency of an input signal which may be properly converted to be limited according to the Nyquist sampling theory.

Examples of conventional analog-to-digital converting circuits include a flash analog-to-digital converter (ADC), a pipelined ADC, and a successive approximation ADC.

A flash ADC converts an analog input signal to a digital signal by using a plurality of comparators having different threshold voltages. The flash ADC performs fast conversion, but requires a large chip area, consumes a lot of power, and is expensive due to the use of a plurality of comparators. The pipelined ADC outputs a digital code for an analog input signal by sequentially converting parts of the analog input signal to digital signals. The pipelined ADC performs fast conversion, but may cause a delay or latency in the conversion. The successive approximation ADC converts an analog input signal to a digital signal according to a method of sequentially correcting a plurality of bits included in a digital signal in the order from a most significant bit to a least significant bit. The successive approximation ADC may have a reduced chip area and consume less power, but the conversion period or duration increases by an amount of time corresponding to the number of bits of the digital signal.

SUMMARY

According to an aspect of the present invention, there is provided a circuit for performing an analog-to-digital conversion of an analog input signal. The circuit comprises: a first comparison circuit configured to perform a first comparison which compares the analog input signal with a first analog signal associated with a first digital signal, and to output a first selection signal based on a result of the first comparison; a second comparison circuit configured to perform a second comparison which compares the analog input signal with a second analog signal associated with a second digital signal, and to output a second selection signal based on a result of the second comparison; and a selection circuit configured to generate intermediate digital signals associated with the first digital signal and output one of the intermediate digital signals as the first digital signal and to output another of the intermediate digital signals as the second digital signal, based on the first selection signal and the second selection signal.

The second digital signal may be a signal associated with the first digital signal and a resolution of the circuit. The difference between two corresponding digital signals from among the intermediate digital signals may be determined based on a resolution of the circuit.

The selection circuit may include an intermediate digital signal generation circuit configured to generate the intermediate digital signals; and a multiplexer configured to output the one of the intermediate digital signals as the first digital signal based on the first selection signal and the second selection signal. The intermediate digital signal generation circuit may include an adder configured to add the first digital signal to a bit corresponding to a resolution of the analog-to-digital converting circuit; a pass circuit configured to pass the first digital signal; and a subtractor configured to subtract the bit corresponding to the resolution of the analog-to-digital converting circuit from the first digital signal. The second digital signal may be an output signal of the subtractor.

The analog-to-digital converting circuit may further include a resolution adjustment circuit configured to adjust the resolution based on a user input. According to another aspect of the present invention, there is provided an accumulation circuit comprising: the analog-to-digital converting circuit; and/or an accumulator configured to accumulate the first digital signal.

According to another aspect of the present invention, there is provided a circuit for performing an analog-to-digital conversion of an analog input signal. The circuit comprises: a first multiplexer; a first comparison circuit configured to perform a first comparison which compares the analog input signal with a first analog signal associated with an output signal of the first multiplexer, and to output a first selection signal based on a result of the first comparison; a successive approximation register configured to perform a successive approximation of the analog input signal based on the first selection signal; a second comparison circuit configured to perform a second comparison which compares the analog input signal with a second analog signal associated with a second digital signal, and to output a second selection signal based on a result of the second comparison; and a selection circuit configured to generate intermediate digital signals associated with the first digital signal and to output one of the intermediate digital signals as the first digital signal and another of the intermediate digital signals as the second digital signal, based on the first selection signal and the second selection signal; and a down counter configured to count down, in response to a clock signal, from a value equal to the number of bits of the first digital signal, wherein the first multiplexer outputs one of the first digital signal and an output signal of the successive approximation register based on an output signal of the down counter.

The second digital signal may be a signal associated with the first digital signal and a resolution of the circuit. The difference between two corresponding digital signals from among the intermediate digital signals may be determined according to a resolution of the circuit.

The selection circuit may include: an intermediate digital signal generation circuit configured to generate the intermediate digital signals; and a second multiplexer configured to output the one of the intermediate digital signals as the first digital signal based on the first selection signal and the second selection signal. The intermediate digital signal generation circuit may include: an adder configured to add the first digital signal to a bit corresponding to a resolution of the analog-to-digital converting circuit; a pass circuit configured to pass the first digital signal; and a subtractor configured to subtract the bit corresponding to the resolution of the analog-to-digital converting circuit from the first digital signal.

The second digital signal may be an output signal of the subtractor. The analog-to-digital converting circuit may further include a resolution adjustment circuit configured to adjust the resolution according to a user input and/or an accumulator configured to accumulate the first digital signal.

According to another aspect of the invention, a digital-to-analog converter (DAC) is provided for performing an analog-to-digital conversion of an analog input signal to produce a digital output signal. The DAC comprises: a selector configured to output in each of a plurality of sequential clock periods, in response to first and second selection signals, a value for the digital output signal as one selected from: (1) a value of the digital output signal in an immediately preceding clock period, (2) an incremented value produced by incrementing the value of the digital output signal of the immediately preceding clock period by a resolution value of the DAC, and (3) a decremented value produced decrementing the value of the digital output signal in the immediately preceding clock period by the resolution value of the DAC; a first comparator configured to perform a first comparison which compares the analog input signal with a first analog signal corresponding to the value of the digital output signal, and to output the first selection signal in response to the first comparison; and a second comparator configured to perform a second comparison which compares the analog input signal with a second analog signal corresponding to the decremented value, and to output the first selection signal in response to the second comparison.

The selector may include a multiplexer which operates in response to the first and second selection signals to select the value for the digital output signal among the incremented value, the decremented value, and the value of the digital output signal in the immediately preceding clock period.

The DAC may further include a resolution adjustment circuit configured to adjust the resolution value of the DAC in response to a user input.

The DAC may further include: a first analog-to-digital converter (ADC) configured to convert the value of the digital output signal to the first analog signal; and a second ADC configured to convert the decremented value to the second analog signal.

The selector may be configured to output the incremented value when the first selection signal indicates that the analog input signal is greater than the first analog signal, to output the decremented value when the analog input signal is less than the decremented value, and otherwise to output the value of the digital output signal in the immediately preceding clock period.

The selector may comprise: an adder configured to add the resolution value of the DAC to the value of the digital output signal of the immediately preceding clock period to produce the incremented value; and a subtractor configured to subtract the resolution value of the DAC from the value of the digital output signal of the immediately preceding clock period to produce the decremented value

BRIEF DESCRIPTION OF THE DRAWINGS

Exemplary embodiments of the present invention will be more clearly understood from the following detailed description taken in conjunction with the accompanying drawings in which.

DETAILED DESCRIPTION OF THE EMBODIMENTS

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
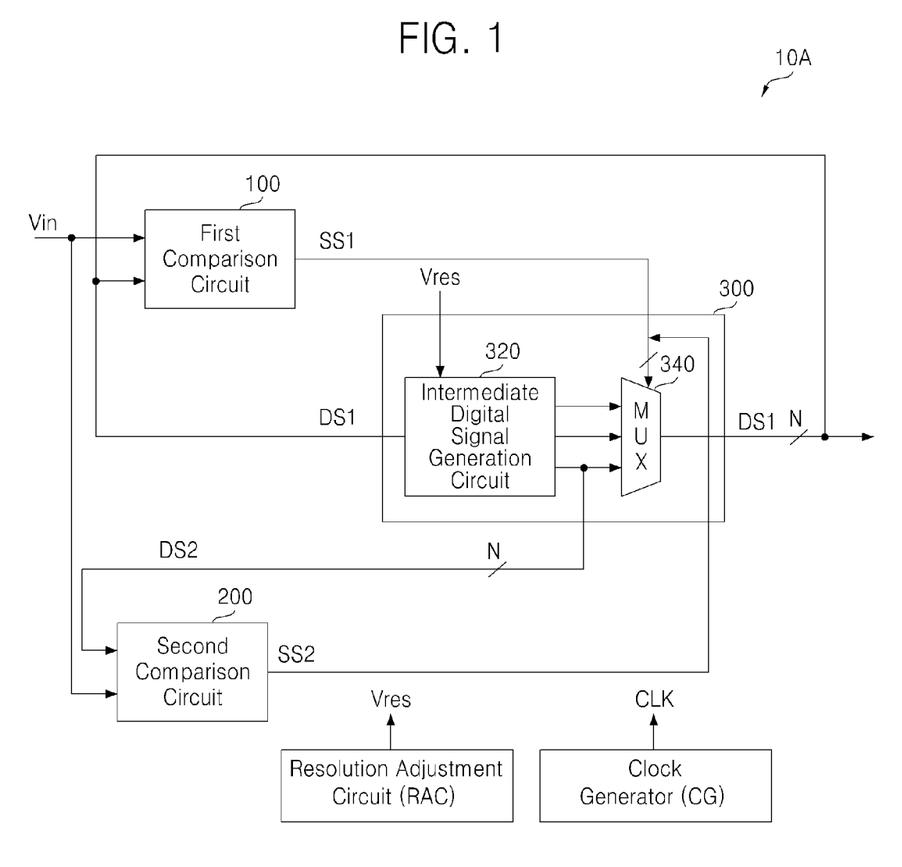
FIG. 1 is a block diagram of an analog-to-digital converting circuit according to an embodiment of the present invention.
Figure 2:
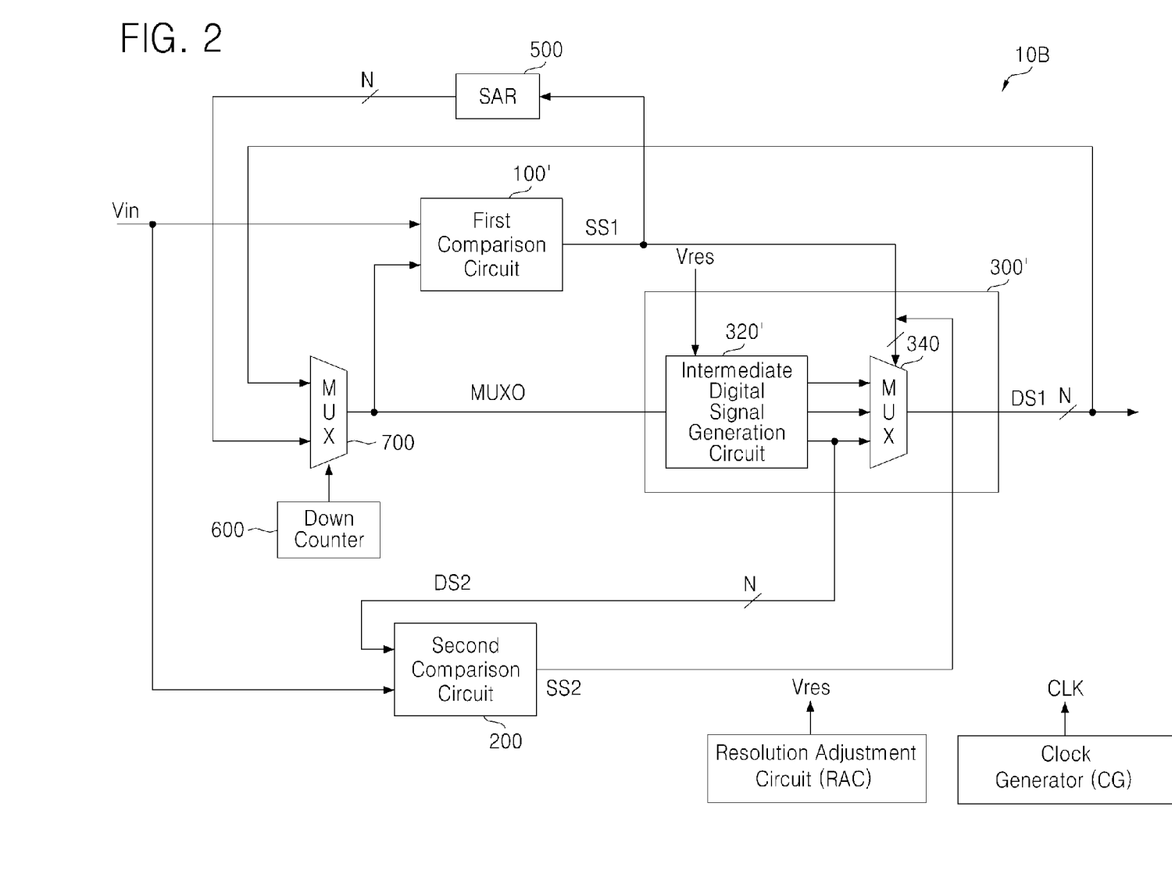
FIG. 2 is a block diagram of an analog-to-digital converting circuit according to another embodiment of the present invention.
Figure 3:
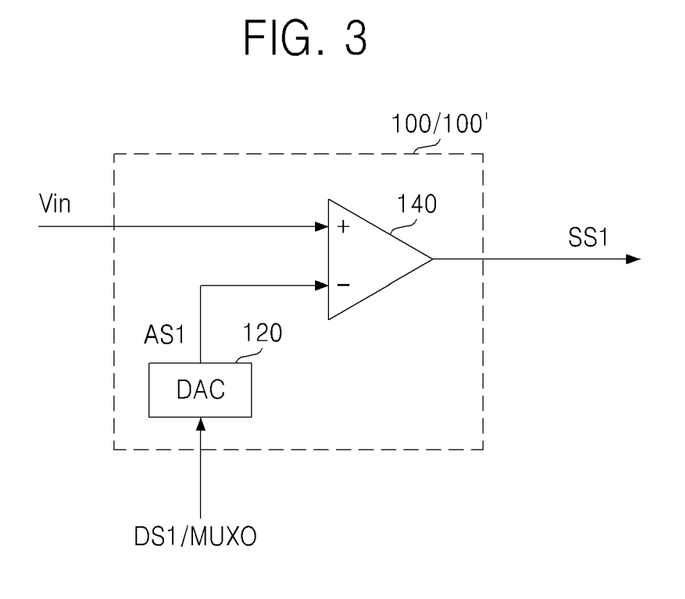
FIG. 3 is a block diagram of an embodiment of the first comparison circuit illustrated in FIG. 1 or FIG. 2.
Figure 4:
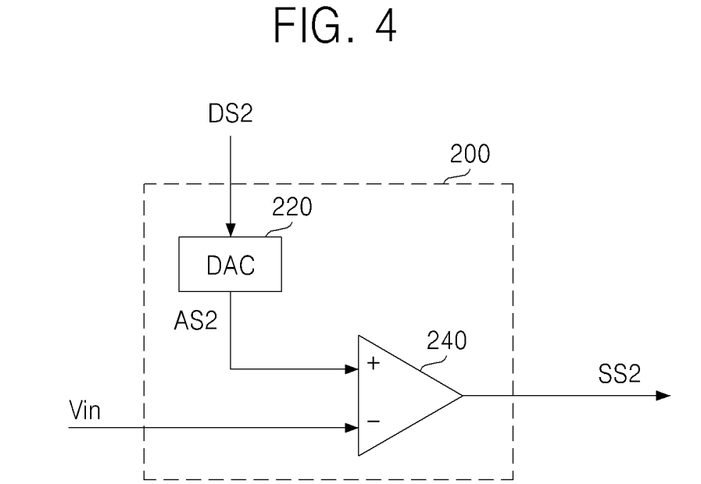
FIG. 4 is a block diagram of an embodiment of the second comparison circuit illustrated in FIG. 1 or FIG. 2.
Figure 5:
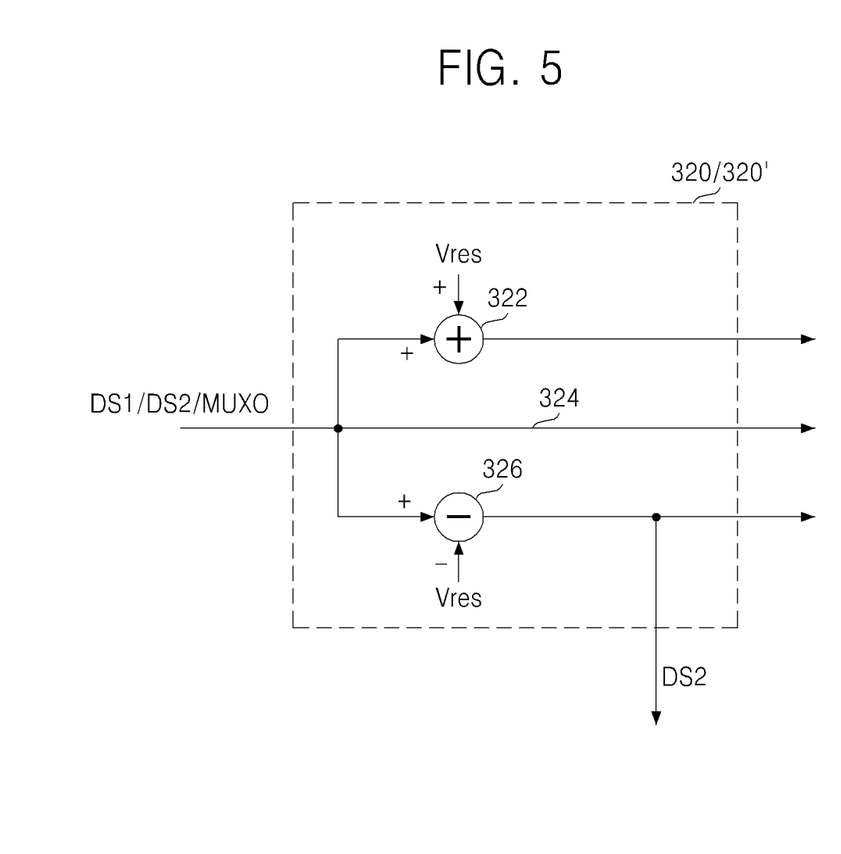
FIG. 5 is a block diagram of an embodiment of the intermediate digital signal generation circuit illustrated in FIG. 1 or FIG. 2.

FIG. 1 is a block diagram of an analog-to-digital converting circuit 10A according to an embodiment of the present invention, FIG. 3 is a block diagram of an embodiment of a first comparison circuit 100 or 100' illustrated in FIG. 1 or 2, FIG. 4 is a block diagram of an embodiment of a second comparison circuit 200 illustrated in FIG. 1 or 2, and FIG. 5 is a block diagram of an embodiment of an intermediate digital signal generation circuit 320 or 320' illustrated in FIG. 1 or 2.

Referring to FIGS. 1, 3, 4, and 5, the analog-to-digital converting circuit 10A includes first comparison circuit 100, second comparison circuit 200, and a selection circuit 300.

First comparison circuit 100 compares a first analog signal AS1 associated with a first digital signal DS1 output from selection circuit 300 with an analog input signal Vin and outputs a first selection signal SS1 according to a result of the comparison. The first digital signal DS1 may be a N-bit digital signal where N denotes a natural number.

As shown in FIG. 3, first comparison circuit 100 includes a first digital-to-analog converter (DAC) 120 and a first comparator 140. First DAC 120 converts the first digital signal DS1 to the first analog signal AS1, and first comparator 140 compares the first analog signal AS1 with the analog input signal Vin.

When the analog input signal Vin is greater than the first analog signal AS1, first comparator 140 may output the first selection signal SS1 at logic level '1'. When the analog input signal Vin is less than the first analog signal AS1, first comparator 140 may output the first selection signal SS1 at logic level '0'.

As shown in FIG. 4, second comparison circuit 200 compares a second analog signal AS2 associated with a second digital signal DS2 output from selection circuit 300 with the analog input signal Vin and outputs a second selection signal SS2 according to a result of the comparison. The second digital signal DS2 may be a N-bit digital signal where N denotes a natural number.

Second digital signal DS2 may be a signal associated with the first digital signal DS1 and a resolution Vres of the analog-to-digital converting circuit 10A. For example, as shown in FIG. 5, the second digital signal DS2 may have a value obtained by subtracting a bit corresponding to the resolution Vres from the first digital signal DS1.

Second comparison circuit 200 includes a second DAC 220 and a second comparator 240. Second DAC 220 converts the second digital signal DS2 to the second analog signal AS2, and second comparator 240 compares the second analog signal AS2 with the analog input signal Vin.

When the analog input signal Vin is less than the second analog signal AS2, second comparator 240 may output the second selection signal SS2 at logic level '1'. When the analog input signal Vin is greater than the second analog signal AS2, second comparator 140 may output the second selection signal SS2 at logic level '0'.

Selection circuit 300 may operate based on a clock signal CLK output from a clock generator CG, and may generate intermediate digital signals associated with the first digital signal DS1 based on the first digital signal DS1 output from selection circuit 300. Selection circuit 300 may output one of the intermediate digital signals as the first digital signal DS1 and output another of the intermediate digital signals as the second digital signal DS2 based on the first selection signal SS1 output from first comparison circuit 100 and the second selection signal SS2 output from second comparison circuit 200. The first and second digital signals DS1 and DS2 may be the same as each other.

Selection circuit 300 includes intermediate digital signal generation circuit 320 and a multiplexer (MUX) 340. Intermediate digital signal generation circuit 320 generates the intermediate digital signals associated with the first digital signal DS1. A difference between two corresponding intermediate digital signals from among the intermediate digital signals may be determined according to the resolution Vres of the analog-to-digital converting circuit 10A.

As shown in FIG. 5, intermediate digital signal generation circuit 320 includes an adder 322, a pass circuit 324, and a subtractor 326. Adder 322 adds the first digital signal DS1 to a bit corresponding to the resolution Vres of analog-to-digital converting circuit 10A. Pass circuit 324 may pass the first digital signal DS1 and may be implemented using a signal line. Subtractor 326 subtracts the bit corresponding to the resolution Vres of analog-to-digital converting circuit 10A from the first digital signal DS1. The second digital signal DS2 may be an output signal of subtractor 326.

MUX 340 may output one of the intermediate digital signals as the first digital signal DS1, based on the first selection signal SS1 output from the first comparison circuit 100 and the second selection signal SS2 output from the second comparison circuit 200.

MUX 340 may output the first digital signal DS1 according to Table 1.

TABLE 1

| SS1 | SS2 | DS1 |
|---|---|---|
| 0 | 0 | Output signal of pass circuit 324 |
| 0 | 1 | Output signal of subtractor 326 |
| 1 | 0 | Output signal of adder 322 |

Analog-to-digital converting circuit 10A may further include a resolution adjustment circuit RAC. The resolution adjustment circuit RAC may adjust the resolution Vres according to a programmable code. The analog-to-digital converting circuit 10A may also further include the clock generator CG. The clock generator CG may adjust the frequency of the clock signal CLK according to a programmable code.

A user, for example, a manufacturer of an electronic device including analog-to-digital converting circuit 10A, may reduce power consumption of analog-to-digital converting circuit 10A by reducing the resolution Vres and/or the frequency of the clock signal CLK, or may allow analog-to-digital converting circuit 10A to perform more accurate analog-to-digital conversion by increasing the resolution Vres and/or the frequency of the clock signal CLK, in a usage stage, for example, in a stage of manufacturing the electronic device.

The electronic device may be implemented to a personal computer (PC), a laptop computer, or a portable device. Examples of the portable device include a mobile phone, a smart phone, and a tablet PC.

The resolution Vres of analog-to-digital converting circuit 10A may be defined as in Equation 1.

$$Vres = \frac{Amplitude}{2^N} \qquad [\text{Equation 1}]$$

where Amplitude indicates an amplitude of the analog input signal Vin, and N indicates the number of bits of a digital signal output from analog-to-digital converting circuit 10A.

In one example, it is assumed that a sine wave Vin=5 sin(2000πt) having a frequency of 1 kHz and an amplitude of 5V is input to analog-to-digital converting circuit 10A in which the clock signal CLK has a frequency of 20 MHz. Since the sine wave Vin is changed at a maximum rate of about 31.4 kV/s (10000π cos(2000πt), @t=0), analog-to-digital converting circuit 10A may perform accurate analog-to-digital conversion when the number of bits of a digital signal that is output according to Equation 1 is no more than $\log_2(1/(31.4 \text{ kV/s}*(1/20 \text{ MHz})/5 \text{ V}))$, that is, 11 bits.

In another example, it is assumed that a sine wave Vin=5 sin(4000πt) having a frequency of 2 kHz and an amplitude of 5V is input to analog-to-digital converting circuit 10A in which the clock signal CLK has a frequency of 20 MHz. Since the sine wave Vin is changed at a maximum rate of about 62.8 kV/s (20000π cos(4000πt), t=0), analog-to-digital converting circuit 10A may perform accurate analog-to-digital conversion when the number of bits of the digital signal that is output according to Equation is no more than $\log_2(1/(62.8 \text{ kV/s}*(1/20 \text{ MHz})/5 \text{ V}))$, that is, 13 bits.

In another example, it is assumed that a sine wave Vin=5 sin(2000πt) having a frequency of 1 kHz and an amplitude of 5V is input to the analog-to-digital converting circuit 10A in which the clock signal CLK has a frequency of 60 MHz. Since the sine wave Vin is changed at a maximum rate of about 31.4 kV/s (10000π cos(2000πt), t=0), the analog-to-digital converting circuit 10A may perform accurate analog-to-digital conversion when the number of bits of the digital signal that is output according to Equation is no more than $\log_2(1/(31.4 \text{ kV/s}*(1/60 \text{ MHz})/5 \text{ V}))$, that is, 10 bits.

In other words, to perform accurate analog-to-digital conversion, the resolution Vres or the frequency of the clock signal CLK needs to increase as the frequency of the analog input signal Vin increases. Accordingly, a user adjusts the resolution Vres of the analog-to-digital converting circuit 10A or the frequency of the clock signal CLK according to types of the analog input signal Vin so that the analog-to-digital converting circuit 10A may perform accurate analog-to-digital conversion.

FIG. 2 is a block diagram of an analog-to-digital converting circuit 10B according to another embodiment of the present invention. As shown in FIGS. 2, 3, 4, and 5, analog-to-digital converting circuit 10B includes first comparison circuit 100', second comparison circuit 200, a selection circuit 300', a successive approximation register (SAR) 500, a down counter 600, and a first MUX 700.

Since the structure and an operation of first comparison circuit 100' of FIG. 2 are the same as those of first comparison circuit 100 of FIG. 1 except that the first comparison circuit 100' receives an output signal MUXO of the first MUX 700 instead of the first digital signal DS1 output from selection circuit 300 of FIG. 1, a detailed description of the structure and the operation of first comparison circuit 100' will now be omitted.

Since the structure and an operation of second comparison circuit 200 of FIG. 2 are the same as those of second comparison circuit 200 of FIG. 1, a detailed description thereof will now be omitted.

Since the structure and an operation of selection circuit 300' of FIG. 2 are the same as those of the selection circuit 300 of FIG. 1 except that the selection circuit 300' receives the output signal MUXO of first MUX 700 instead of the first digital signal DS1, a detailed description of the structure and the operation of selection circuit 300' will now be omitted.

SAR 500 performs successive approximation the analog input signal Vin according to a first selection signal SS1 output from first comparison circuit 100'. Down counter 600 counts down by the number of bits of the first digital signal DS1. For example, when the first digital signal DS1 is formed of 10 bits, the down counter 600 counts down 10 times in response to the clock signal CLK. First MUX 700 outputs one of the first digital signal DS1 output from selection circuit 300' and an output signal of SAR 500, based on an output signal of down counter 600.

In other words, analog-to-digital converting circuit 10B performs analog-to-digital conversion on an initial analog input signal Vin according to a successive approximation method during an initial operation, and then performs analog-to-digital conversion on the analog input signal Vin by using first comparison circuit 100', second comparison circuit 200, and selection circuit 300'.

Figure 6:
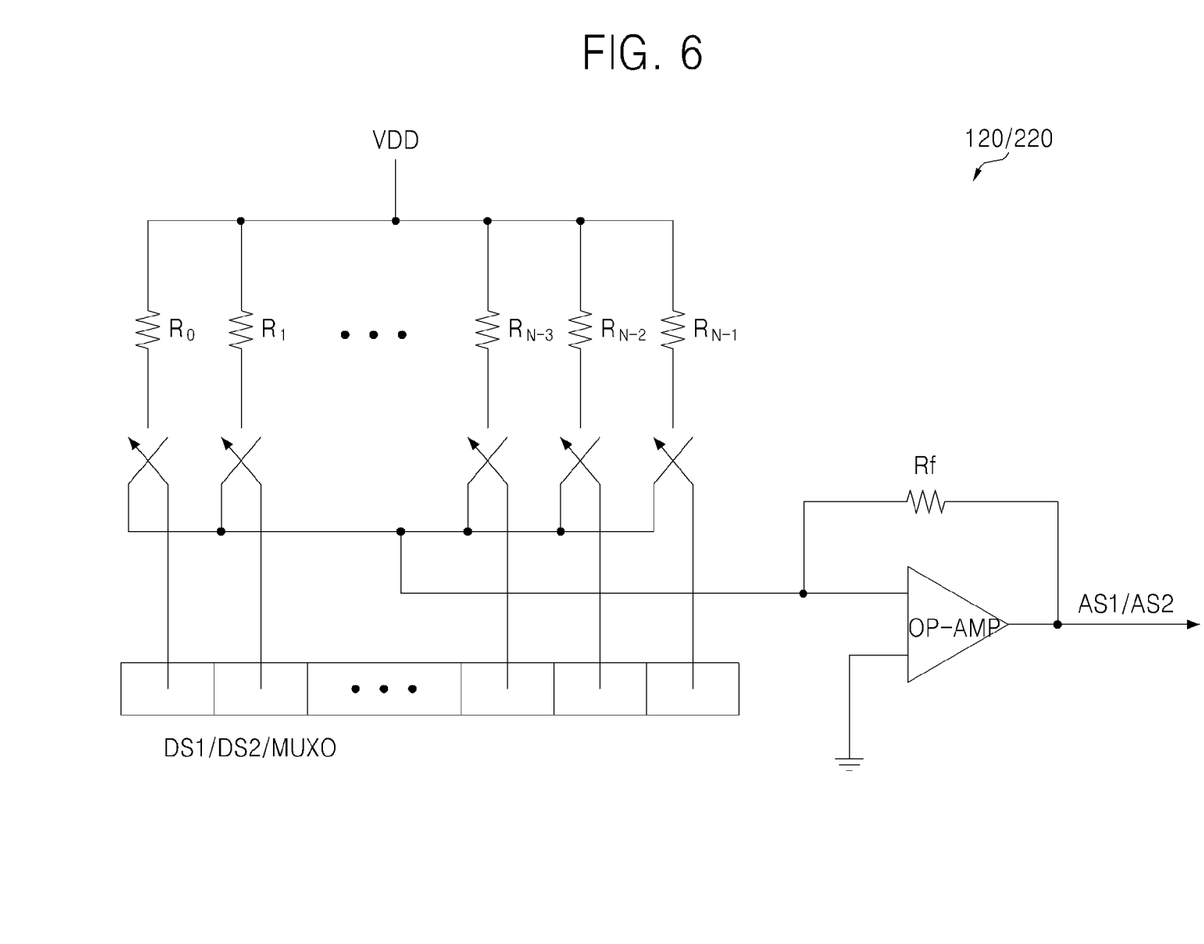
FIG. 6 is a circuit diagram of an embodiment of the digital-to-analog converter (DAC) illustrated in FIG. 3 or FIG. 4.

FIG. 6 is a circuit diagram of an embodiment of first DAC 120 illustrated in FIG. 3 or second DAC 220 illustrated in FIG. 4. Referring to FIG. 6, each of first DAC 120 and second DAC 220 include N resistors, N switches, an operational amplifier (OP-AMP), and a feedback resistor Rf.

Each of the switches is turned on/off based on the level of each of the bits of a digital signal, namely, the first digital signal DS1, the second digital signal DS2, or the output signal MUXO. Accordingly, the OP-AMP operates as a summing amplifier to output the first or second analog signal AS1 or AS2 associated with the digital signal DS1, DS2, or MUXO. For example, first DAC 120 and second DAC 220 each may serve as a binary-weighted DAC and convert the digital signal DS1, DS2, or MUXO to the first or second analog signal AS1 or AS2 without delay.

Selection circuit 300', SAR 500, down counter 600, and first MUX 700 of FIG. 2 may operate based on the clock signal CLK output from the clock generator CG.

Figure 7:
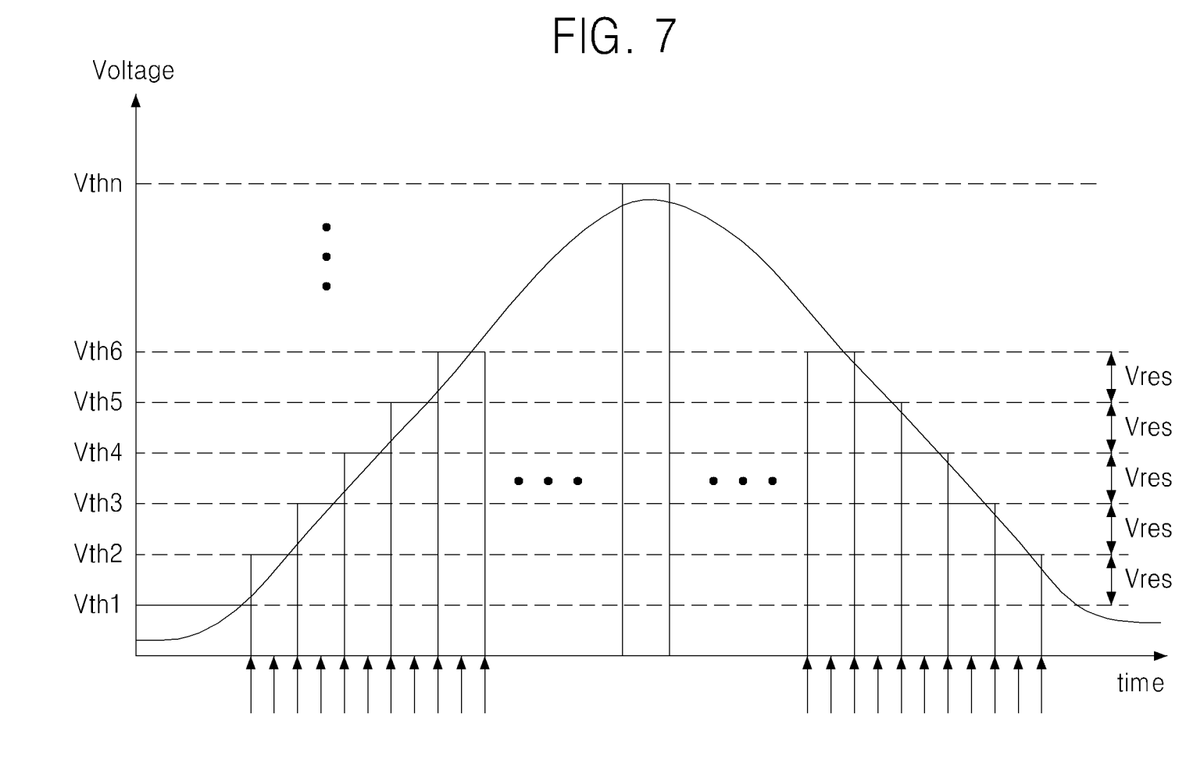
FIG. 7 is a graph for explaining a method of operating the analog-to-digital converting circuit illustrated in FIG. 1 or FIG. 2.

FIG. 7 is a graph for explaining a method of operating analog-to-digital converting circuit 10A or 10B illustrated in FIG. 1 or 2. Referring to FIGS. 1 through 7, analog-to-digital converting circuit 10A or 10B, generally, an analog-to-digital converting circuit 10, converts the analog input signal Vin to the digital signal every period of the clock signal CLK.

For example, when the first digital signal DS1 corresponds to a voltage Vth1 and the analog input signal Vin is greater than the voltage Vth1, the first selection signal SS1 output from first comparison circuit 100 or 100', generally, a first comparison circuit 100, has the logic level '1', and the second selection signal SS2 output the second comparison circuit 200 has the logic level '0'. At this time, selection circuit 300 or 300', generally, a selection circuit 300, outputs an output signal of adder 322 as the first digital signal DS1 based on the first selection signal SS1 and the second selection signal SS2. Accordingly, the first digital signal DS1 is changed to correspond to a voltage Vth2.

On the other hand, when the first digital signal DS1 corresponds to the voltage Vth2 and the analog input signal Vin is less than the voltage Vth2 and greater than the voltage Vth1, the first selection signal SS1 output from first comparison circuit 100 has the logic level '0', and the second selection signal SS2 output from second comparison circuit 200 represents the logic level '0'. At this time, selection circuit 300 outputs an output signal of pass circuit 324 as the first digital signal DS1 based on the first selection signal SS1 and the second selection signal SS2. Accordingly, the first digital signal DS1 is maintained to continuously correspond to the voltage Vth2.

On the other hand, when the first digital signal DS1 corresponds to the voltage Vth2 and the analog input signal Vin is less than the voltage Vth1, the first selection signal SS1 output from first comparison circuit 100 has the logic level '0', and the second selection signal SS2 output from second comparison circuit 200 has the logic level '1'. At this time, selection circuit 300 outputs the output signal of subtractor 326 as the first digital signal DS1 based on the first selection signal SS1 and the second selection signal SS2. Accordingly, the first digital signal DS1 is changed to correspond to the voltage Vth1.

Figure 8:
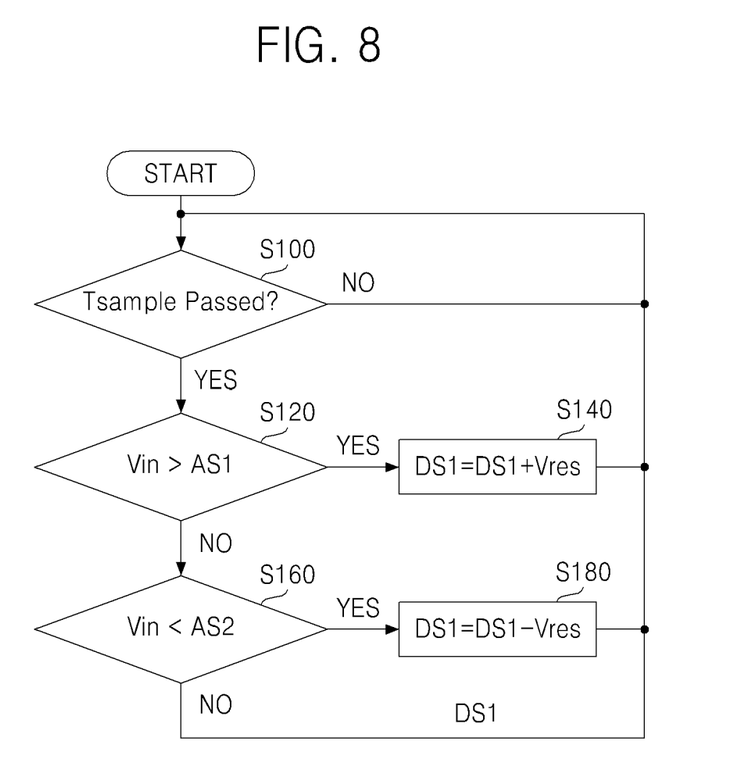
FIG. 8 is a flowchart of a method of operating an analog-to-digital converting circuit, according to an embodiment of the present invention.

FIG. 8 is a flowchart of a method of operating analog-to-digital converting circuit 10, according to an embodiment of the present invention. Referring to FIG. 8, analog-to-digital converting circuit 10 determines whether a sampling period Tsampling has passed, in operation S100. In other words, analog-to-digital converting circuit 10 performs a new analog-to-digital conversion every period of the clock signal CLK.

When it is determined in operation S100 that the sampling period Tsampling has passed, analog-to-digital converting circuit 10 compares the analog input signal Vin with the first analog signal AS1, in operation S120. When the magnitude of the analog input signal Vin is greater than that of the first analog signal AS1, analog-to-digital converting circuit 10 changes the first digital signal DS1 to a value obtained by adding a previous first digital signal to a bit corresponding to the resolution Vres, in operation S140.

When the magnitude of the analog input signal Vin is less than that of the first analog signal AS1, analog-to-digital converting circuit 10 compares the analog input signal Vin with the second analog signal AS2, in operation S160. When the magnitude of the analog input signal Vin is less than that of the second analog signal AS2, analog-to-digital converting circuit 10 changes the first digital signal DS1 to a value obtained by subtracting the bit corresponding to the resolution Vres from the previous first digital signal, in operation S180.

When the magnitude of the analog input signal Vin is greater than the second analog signal AS2 and less than that of the first analog signal AS1, analog-to-digital converting circuit 10 maintains the first digital signal DS1.

Although the operation S140 is performed after the operation S120 in FIG. 8 for convenience of explanation, the operations S120 and S140 may be performed simultaneously.

Figure 9:
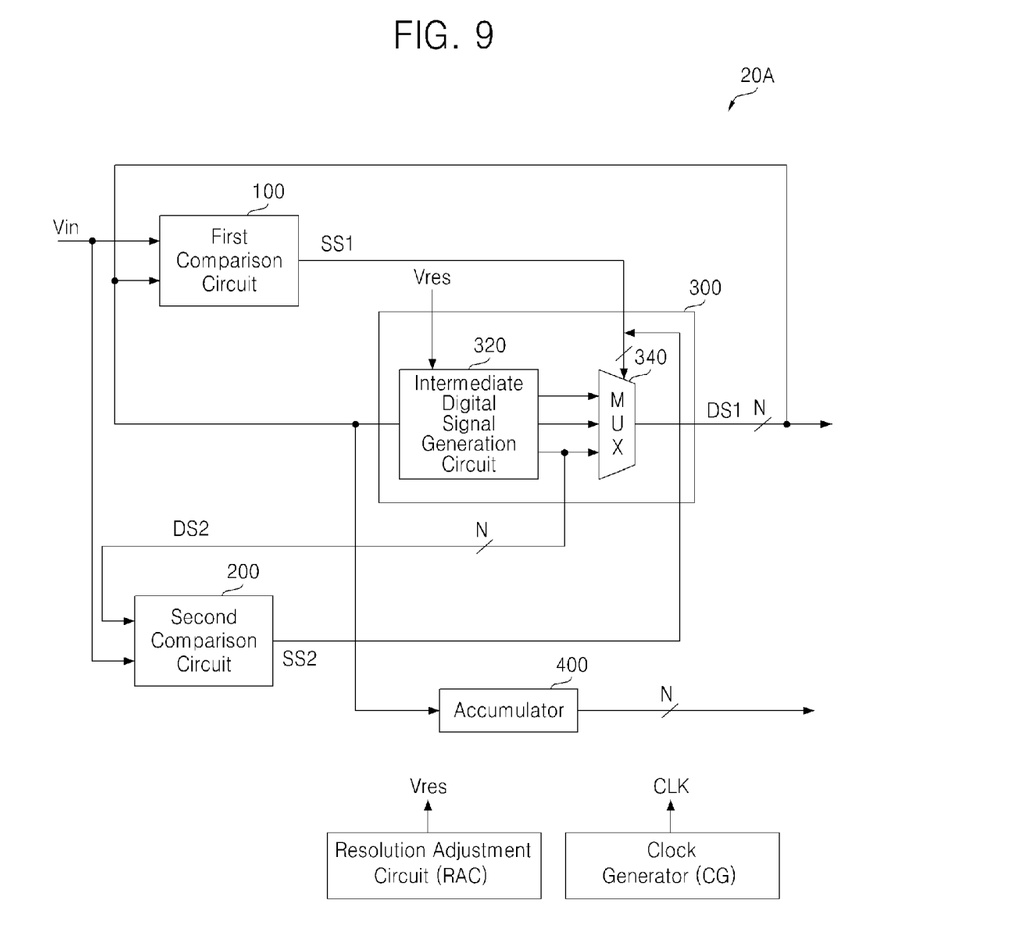
FIG. 9 is a block diagram of an accumulation circuit according to an embodiment of the present invention.

FIG. 9 is a block diagram of an accumulation circuit 20A according to an embodiment of the present invention. Referring to FIG. 9, accumulation circuit 20A includes first comparison circuit 100, second comparison circuit 200, selection circuit 300, and an accumulator 400.

Since structures and operations of first comparison circuit 100, second comparison circuit 200, and selection circuit 300 of FIG. 9 are the same as are the same as described above with respect to FIG. 1, a detailed description thereof will be omitted. Accumulator 400 accumulates the first digital signal DS1 output from selection circuit 300.

Figure 10:
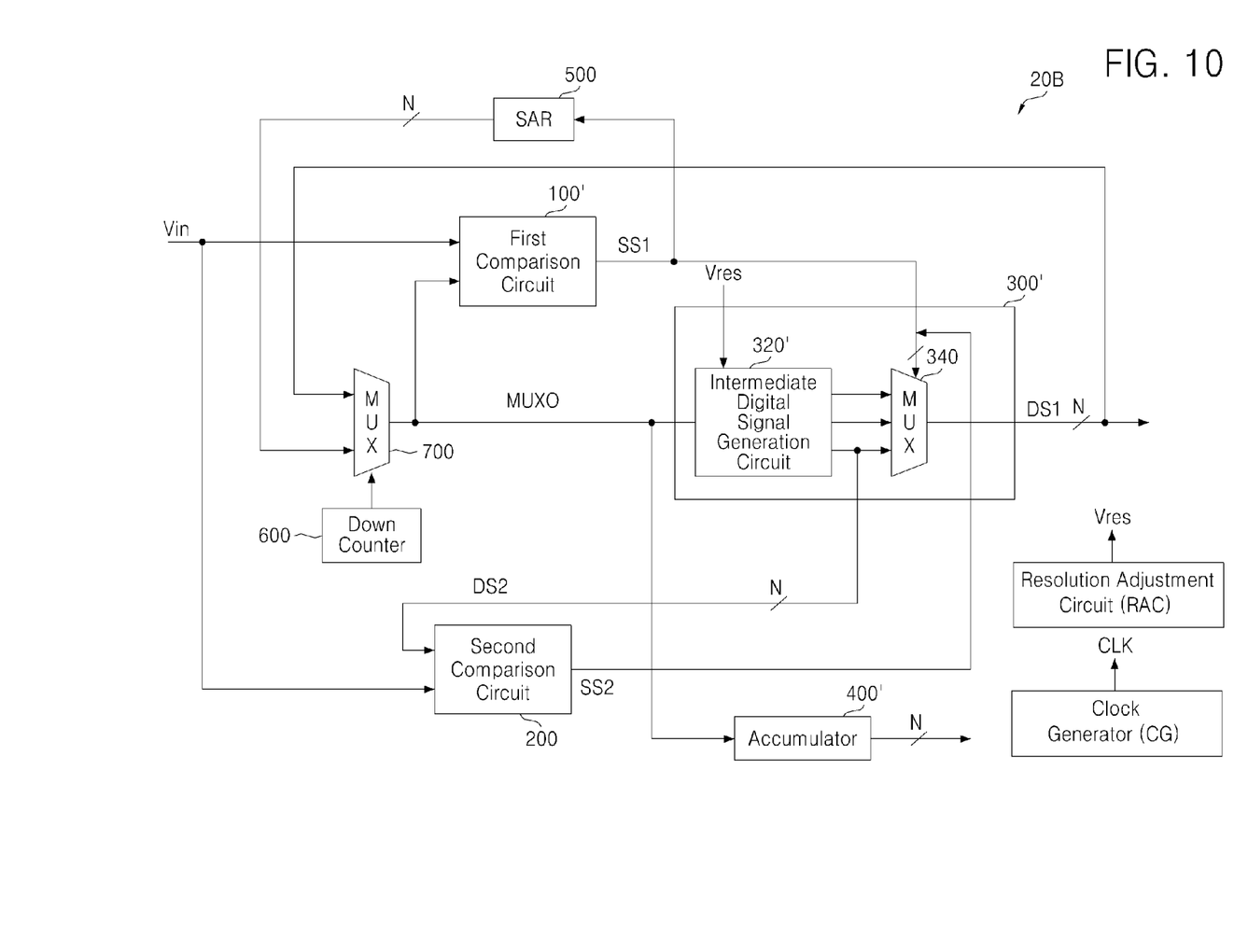
FIG. 10 is a block diagram of an accumulation circuit according to another embodiment of the present invention.

FIG. 10 is a block diagram of an accumulation circuit 20B according to another embodiment of the present invention. Referring to FIG. 10, accumulation circuit 20B includes first comparison circuit 100', second comparison circuit 200, selection circuit 300', SAR 500, down counter 600, first MUX 700, and an accumulator 400'.

Since structures and operations of first comparison circuit 100', second comparison circuit 200, selection circuit 300', SAR 500, down counter 600, and first MUX 700 of FIG. 10 are the same as described above with respect to FIG. 2, a detailed description thereof will be omitted. The accumulator 400' accumulates an output signal of first MUX 700. Alternatively, the accumulator 400' may accumulate an output signal of selection circuit 300'.

Figure 11:
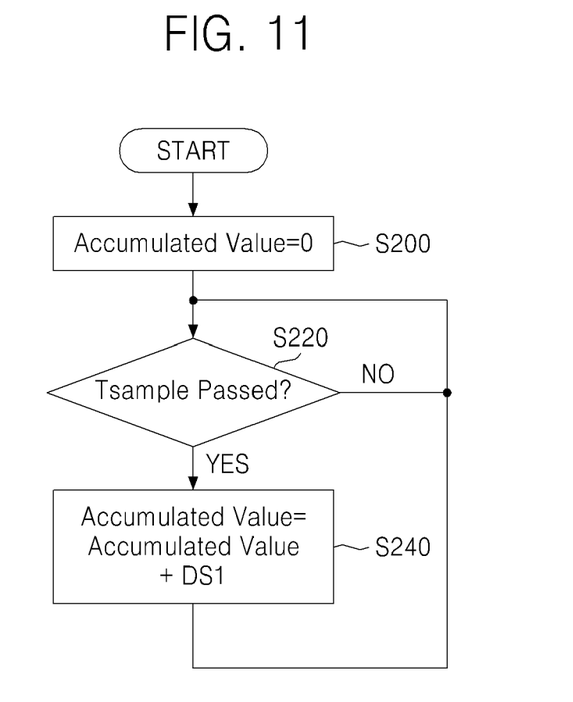
FIG. 11 is a flowchart of a method of operating an accumulation circuit, according to an embodiment of the present invention.

FIG. 11 is a flowchart of a method of operating accumulation circuit 20, according to an embodiment of the present invention. Referring to FIG. 11, accumulation circuit 20A or 20B, generally, accumulation circuit 20, initializes an accumulated value during an initial operation, in operation S200. The accumulation circuit 20 determines whether the sampling period Tsampling has passed, in operation S220. When it is determined in operation S220 that the sampling period Tsampling has passed, accumulation circuit 20 accumulates the first digital signal DS1 or the output signal MUXO of the first MUX 700. In other words, accumulation circuit 20 accumulates the first digital signal DS1 or the output signal MUXO of the first MUX 700 every clock signal CLK. In other words, accumulation circuit 20 operates based on the clock signal CLK.

An analog-to-digital converting circuit according to an embodiment of the present invention may perform analog-to-digital conversion without delay because a conversion period or duration is one clock period. In addition, an analog-to-digital converting circuit according to an embodiment of the present invention may adjust the frequency of a clock signal and the resolution in a usage stage, for example, in a stage of manufacturing the electronic device.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A circuit for performing an analog-to-digital conversion of an analog input signal, the circuit comprising:
   a first comparison circuit configured to perform a first comparison which compares the analog input signal with a first analog signal associated with a first digital signal, and to output a first selection signal based on a result of the first comparison;
   a second comparison circuit configured to perform a second comparison which compares the analog input signal with a second analog signal associated with a second digital signal, and to output a second selection signal based on a result of the second comparison; and
   a selection circuit configured to generate intermediate digital signals associated with the first digital signal and to output one of the intermediate digital signals as the first digital signal and to output another of the intermediate digital signals as the second digital signal, based on the first selection signal and the second selection signal.

2. The circuit of claim 1, wherein the second digital signal is a signal associated with the first digital signal and a resolution of the circuit.

3. The circuit of claim 1, wherein a difference between two corresponding digital signals from among the intermediate digital signals is determined based on a resolution of the circuit.

4. The circuit of claim 1, wherein the selection circuit includes:
an intermediate digital signal generation circuit configured to generate the intermediate digital signals; and
a multiplexer configured to output the one of the intermediate digital signals as the first digital signal based on the first selection signal and the second selection signal, and
wherein the intermediate digital signal generation circuit includes:
an adder configured to add the first digital signal to a bit corresponding to a resolution of the analog-to-digital converting circuit;
a pass circuit configured to pass the first digital signal; and
a subtractor configured to subtract the bit corresponding to the resolution of the circuit from the first digital signal.

5. The circuit of claim 4, wherein the second digital signal is an output signal of the subtractor.

6. The circuit of claim 4, further comprising a resolution adjustment circuit configured to adjust the resolution based on a user input.

7. The circuit of claim 1, further comprising:
an accumulator configured to accumulate the first digital signal.

8. A circuit for performing an analog-to-digital conversion of an analog input signal, the circuit comprising:
a first multiplexer;
a first comparison circuit configured to perform a first comparison which compares the analog input signal with a first analog signal associated with an output signal of the first multiplexer, and to output a first selection signal based on a result of the first comparison;
a successive approximation register configured to perform a successive approximation of the analog input signal based on the first selection signal;
a second comparison circuit configured to perform a second comparison which compares a second analog signal associated with a second digital signal, and to output a second selection signal based on a result of the second comparison;
a selection circuit configured to generate intermediate digital signals associated with the first digital signal and to output one of the intermediate digital signals as the first digital signal and another of the intermediate digital signals as the second digital signal, based on the first selection signal and the second selection signal; and
a down counter configured to count down, in response to a clock signal, from a value equal to a number of bits of the first digital signal,
wherein the first multiplexer is configured to output one of the first digital signal and an output signal of the successive approximation register based on an output signal of the down counter.

9. The circuit of claim 8, wherein the second digital signal is a signal associated with the first digital signal and a resolution of the circuit.

10. The circuit of claim 8, wherein a difference between two corresponding digital signals from among the intermediate digital signals is determined based on a resolution of the circuit.

11. The circuit of claim 8,
wherein the selection circuit includes:
an intermediate digital signal generation circuit configured to generate the intermediate digital signals; and
a second multiplexer configured to output the one of the intermediate digital signals as the first digital signal based on the first selection signal and the second selection signal, and
wherein the intermediate digital signal generation circuit includes:
an adder configured to add the first digital signal to a bit corresponding to a resolution of the analog-to-digital converting circuit;
a pass circuit configured to pass the first digital signal; and
a subtractor configured to subtract the bit corresponding to the resolution of the circuit from the first digital signal.

12. The circuit of claim 11, wherein the second digital signal is an output signal of the subtractor.

13. The circuit of claim 11, further comprising a resolution adjustment circuit configured to adjust the resolution according to a user input.

14. The circuit of claim 8, further comprising:
an accumulator configured to accumulate the first digital signal.

15. A digital-to-analog converter (DAC) for performing an analog-to-digital conversion of an analog input signal to produce a digital output signal, the DAC comprising:
a selector configured to output in each of a plurality of sequential clock periods, in response to first and second selection signals, a value for the digital output signal as one selected from: (1) a value of the digital output signal in an immediately preceding clock period, (2) an incremented value produced by incrementing the value of the digital output signal of the immediately preceding clock period by a resolution value of the DAC, and (3) a decremented value produced decrementing the value of the digital output signal in the immediately preceding clock period by the resolution value of the DAC;
a first comparator configured to perform a first comparison which compares the analog input signal with a first analog signal corresponding to the value of the digital output signal, and to output the first selection signal in response to the first comparison; and
a second comparator configured to perform a second comparison which compares the analog input signal with a second analog signal corresponding to the decremented value, and to output the first selection signal in response to the second comparison.

16. The DAC of claim 15, wherein the selector includes a multiplexer which operates in response to the first and second selection signals to select the value for the digital output signal among the incremented value, the decremented value, and the value of the digital output signal in the immediately preceding clock period.

17. The DAC of claim 15, further comprising a resolution adjustment circuit configured to adjust the resolution value of the DAC in response to a user input.

18. The DAC of claim 15, further comprising:
a first analog-to-digital converter (ADC) configured to convert the value of the digital output signal to the first analog signal; and
a second ADC configured to convert the decremented value to the second analog signal.

19. The DAC of claim 15, wherein the selector is configured to output the incremented value when the first selection signal indicates that the analog input signal is greater than the first analog signal, to output the decremented value when the analog input signal is less than the decremented value, and otherwise to output the value of the digital output signal in the immediately preceding clock period.

20. The DAC of claim 15, wherein selector comprises:
an adder configured to add the resolution value of the DAC to the value of the digital output signal of the immediately preceding clock period to produce the incremented value; and
a subtractor configured to subtract the resolution value of the DAC from the value of the digital output signal of the immediately preceding clock period to produce the decremented value.

* * * * *